US011588062B2

(12) United States Patent
Aboketaf et al.

(10) Patent No.: US 11,588,062 B2
(45) Date of Patent: Feb. 21, 2023

(54) PHOTODETECTORS INCLUDING A COUPLING REGION WITH MULTIPLE TAPERS

(71) Applicant: GLOBALFOUNDRIES U.S. Inc., Santa Clara, CA (US)

(72) Inventors: Abdelsalam Aboketaf, Essex Junction, VT (US); Yusheng Bian, Ballston Lake, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 190 days.

(21) Appl. No.: 17/065,839

(22) Filed: Oct. 8, 2020

(65) Prior Publication Data

US 2022/0115546 A1    Apr. 14, 2022

(51) Int. Cl.
| | |
|---|---|
| *H01L 31/0352* | (2006.01) |
| *H01L 31/0232* | (2014.01) |
| *H01L 31/18* | (2006.01) |
| *H01L 31/102* | (2006.01) |

(52) U.S. Cl.
CPC ...... *H01L 31/02327* (2013.01); *H01L 31/102* (2013.01); *H01L 31/1812* (2013.01)

(58) Field of Classification Search
CPC ............. H01L 31/02327; H01L 31/102; H01L 31/1812
See application file for complete search history.

(56) References Cited

U.S. PATENT DOCUMENTS

| | | | | |
|---|---|---|---|---|
| 5,121,182 | A * | 6/1992 | Kuroda | G02B 6/42 257/14 |
| 6,108,478 | A * | 8/2000 | Harpin | G02B 6/1228 385/132 |
| 7,251,406 | B2 * | 7/2007 | Luo | G02B 6/1228 385/28 |
| 7,305,157 | B2 * | 12/2007 | Ahn | G02B 6/1228 385/14 |
| 7,532,784 | B2 * | 5/2009 | Tolshikhin | G02B 6/1228 385/24 |
| 7,616,904 | B1 | 11/2009 | Gunn, III et al. | |
| 8,625,942 | B2 * | 1/2014 | Na | G02B 6/1228 385/27 |
| 9,690,043 | B2 * | 6/2017 | Matsumoto | G02B 6/1228 |

(Continued)

OTHER PUBLICATIONS

Bian et al., "Semiconductor Detectors With Butt-End Coupled Waveguide and Method Of Forming the Same" filed Aug. 19, 2019 as U.S. Appl. No. 16/544,866.

(Continued)

*Primary Examiner* — Bitew A Dinke
(74) *Attorney, Agent, or Firm* — Thompson Hine LLP; Anthony Canale

(57) ABSTRACT

Structures for a photodetector and methods of fabricating a structure for a photodetector. A photodetector includes a photodetector pad coupled to a waveguide core and a light-absorbing layer coupled to the photodetector pad. The light-absorbing layer has a body, a first taper that projects laterally from the body toward the waveguide core, and a second taper that projects laterally from the body toward the waveguide core. The photodetector pad includes a tapered section that is laterally positioned between the first taper and the second taper of the light-absorbing layer.

19 Claims, 9 Drawing Sheets

(56) References Cited

U.S. PATENT DOCUMENTS

| | | | |
|---|---|---|---|
| 10,103,280 B1* | 10/2018 | Ellis-Monaghan | H01L 27/144 |
| 10,429,581 B1* | 10/2019 | Thomas | G02B 6/13 |
| 10,444,433 B1* | 10/2019 | Bian | G02B 6/136 |
| 10,461,504 B2* | 10/2019 | Watson | H01S 5/2232 |
| 10,720,538 B2 | 7/2020 | Assefa et al. | |
| 10,795,083 B1* | 10/2020 | Bian | G02B 6/1228 |
| 11,022,824 B2* | 6/2021 | Yu | G02F 1/025 |
| 11,256,030 B1* | 2/2022 | Chandran | G02B 6/1225 |
| 11,280,961 B1* | 3/2022 | Hammond | G02B 6/12007 |
| 2004/0218868 A1* | 11/2004 | Liu | G02F 1/225 385/45 |
| 2006/0133754 A1* | 6/2006 | Patel | G02B 6/1228 385/129 |
| 2007/0077017 A1* | 4/2007 | Menon | H01S 5/162 359/344 |
| 2007/0116398 A1* | 5/2007 | Pan | H01L 27/1443 385/9 |
| 2007/0171515 A1* | 7/2007 | Kang | H01S 5/50 359/344 |
| 2008/0105940 A1* | 5/2008 | Piede | H01L 31/03529 257/E31.127 |
| 2009/0324164 A1* | 12/2009 | Reshotko | G02B 6/1228 257/432 |
| 2011/0135314 A1* | 6/2011 | Tolstikhin | H01S 5/0262 398/149 |
| 2011/0217045 A1* | 9/2011 | Watson | H04B 10/85 398/79 |
| 2015/0146755 A1* | 5/2015 | Kim | G02B 6/122 438/31 |
| 2016/0091676 A1* | 3/2016 | Favreau | G02B 6/4204 216/13 |
| 2016/0260849 A1* | 9/2016 | Assefa | H01L 31/1808 |
| 2016/0293788 A1* | 10/2016 | Okumura | H01L 31/105 |
| 2017/0104109 A1* | 4/2017 | Simoyama | H01L 31/028 |
| 2017/0214216 A1* | 7/2017 | Dong | H01S 5/0215 |
| 2018/0164501 A1* | 6/2018 | Norberg | G02B 6/125 |
| 2018/0321444 A1* | 11/2018 | Wyss | G02B 6/305 |
| 2019/0353845 A1* | 11/2019 | Fathololoumi | G02B 6/4207 |
| 2020/0303903 A1* | 9/2020 | Yagi | H01L 21/76251 |
| 2021/0215875 A1* | 7/2021 | Koch | G02B 6/107 |
| 2021/0223478 A1* | 7/2021 | Song | G02B 6/29344 |

OTHER PUBLICATIONS

M. Rakowski, C. Meagher, K. Nummy, A. Aboketaf, J. Ayala, Y. Bian, B. Harris, K. Mclean, K. McStay, A. Sahin, L. Medina, B. Peng, Z. Sowinski, A. Stricker, T. Houghton, C. Hedges, K. Giewont, A. Jacob, T. Letavic, D. Riggs, A. Yu, and J. Pellerin, "45nm CMOS—Silicon Photonics Monolithic Technology (45CLO) for next-generation, low power and high speed optical interconnects," in Optical Fiber Communication Conference (OFC) 2020, OSA Technical Digest (Optical Society of America, 2020), paper T3H.3.

N. Duan, T. Liow, A. E. Lim, L. Ding, and G. Q. Lo, "High Speed Waveguide-Integrated Ge/Si Avalanche Photodetector," in Optical Fiber Communication Conference/National Fiber Optic Engineers Conference 2013, OSA Technical Digest (online) (Optical Society of America, 2013), paper OM3K.3.

Donghwan Ahn, Ching-yin Hong, Jifeng Liu, Wojciech Giziewicz, Mark Beals, Lionel C. Kimerling, Jurgen Michel, Jian Chen, and Franz X. Kärtner, "High performance, waveguide integrated Ge photodetectors," Opt. Express 15, 3916-3921 (2007).

K. Giewont et al., "300-mm Monolithic Silicon Photonics Foundry Technology," in IEEE Journal of Selected Topics in Quantum Electronics, vol. 25, No. 5, pp. 1-11, Sep.-Oct. 2019, Art No. 8200611, doi: 10.1109/JSTQE.2019.2908790.

H. Chen, P. Verheyen, P. De Heyn, G. Lepage, J. De Coster, S. Balakrishnan, P. Absil, W. Yao, L. Shen, G. Roelkens, and J. Van Campenhout, "-1 V bias 67 GHz bandwidth Si-contacted germanium waveguide p-i-n photodetector for optical links at 56 Gbps and beyond," Opt. Express 24, 4622-4631 (2016).

Kyle Preston, Yoon Ho Daniel Lee, Mian Zhang, and Michal Lipson, "Waveguide-integrated telecom-wavelength photodiode in deposited silicon," Opt. Lett. 36, 52-54 (2011).

S. Assefa, F. Xia, S. W. Bedell, Y. Zhang, T. Topuria, P. M. Rice, and Y. A. Vlasov, "CMOS-Integrated 40GHz Germanium Waveguide Photodetector for On-chip Optical Interconnects," in Optical Fiber Communication Conference and National Fiber Optic Engineers Conference, OSA Technical Digest (CD) (Optical Society of America, 2009), paper OMR4.

Mu, X.; Wu, S.; Cheng, L.; Fu, H., "Edge Couplers in Silicon Photonic Integrated Circuits: A Review", Published Feb. 24, 2020, Appl. Sci. 10, 1538.

* cited by examiner

PHOTODETECTORS INCLUDING A COUPLING REGION WITH MULTIPLE TAPERS

BACKGROUND

The present invention relates to photonics chips and, more specifically, to structures for a photodetector and methods of forming a structure for a photodetector.

Photonics chips are used in many applications and systems including, but not limited to, data communication systems and data computation systems. A photonics chip integrates optical components, such as waveguides, optical switches, directional couplers, and bends, and electronic components, such as field-effect transistors, into a unified platform. Among other factors, layout area, cost, and operational overhead may be reduced by the integration of both types of components on the same chip.

Photonics chips may include photodetectors that convert modulated pulses of light into an electrical signal. Photodetectors may suffer from significant back reflection producing optical return loss. Photodetectors may also exhibit significant responsivity degradation over time.

Improved structures for a photodetector and methods of fabricating a structure for a photodetector are needed.

SUMMARY

In an embodiment of the invention, a structure includes a waveguide core and a photodetector having a photodetector pad coupled to the waveguide core. The photodetector further includes a light-absorbing layer coupled to the photodetector pad. The light-absorbing layer has a body, a first taper that projects laterally from the body toward the waveguide core, and a second taper that projects laterally from the body toward the waveguide core. The photodetector pad includes a tapered section that is laterally positioned between the first taper and the second taper of the light-absorbing layer.

In an embodiment of the invention, a method includes forming a waveguide core and a photodetector pad coupled to the waveguide core, and forming a light-absorbing layer coupled to the photodetector pad. The light-absorbing layer includes a body, a first taper that projects laterally from the body toward the waveguide core, and a second taper that projects laterally from the body toward the waveguide core. The photodetector pad includes a tapered section that is laterally positioned between the first taper and the second taper of the light-absorbing layer. The light-absorbing layer and the photodetector pad are included in a photodetector.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
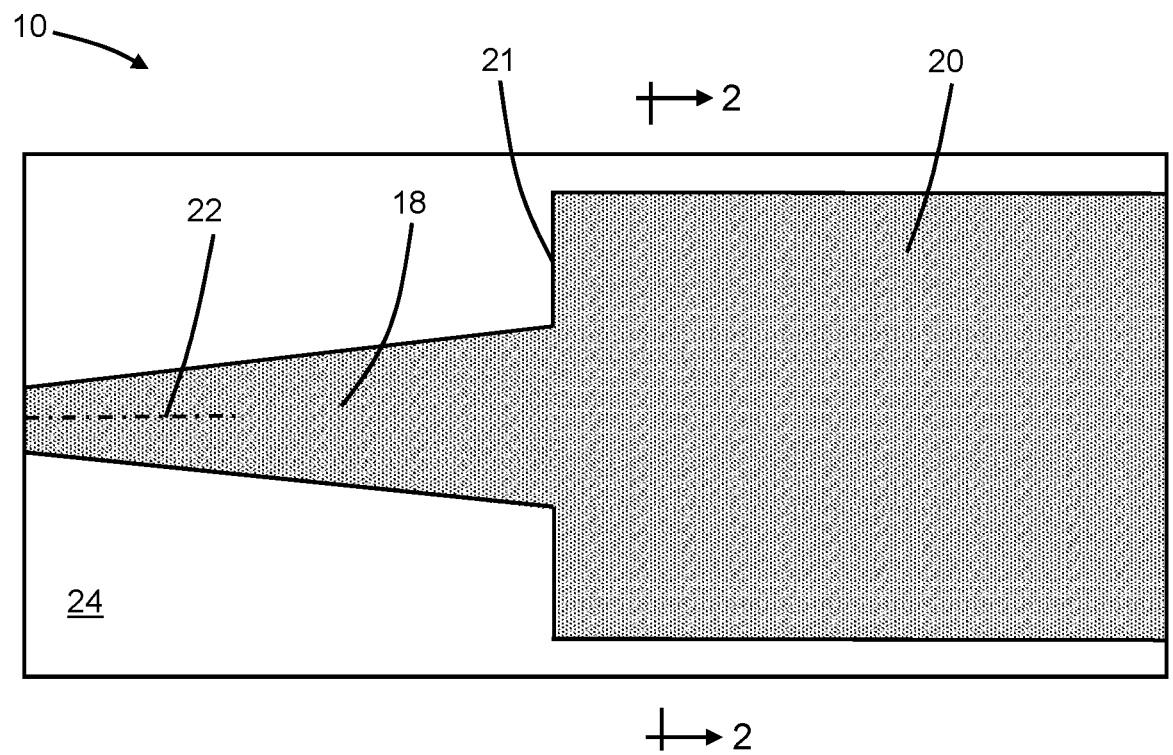
FIG. 1 is a diagrammatic top view of a structure at an initial fabrication stage of a processing method in accordance with embodiments of the invention.
Figure 2:
FIG. 2 is a cross-sectional view taken generally along line 2-2 in FIG. 1.

With reference to FIGS. 1, 2 and in accordance with embodiments of the invention, a structure 10 may be formed using a semiconductor-on-insulator (SOI) substrate that includes a device layer 12, a dielectric layer 14, and a handle wafer 16. The device layer 12 is separated from the handle wafer 16 by the intervening dielectric layer 14 and may be significantly thinner than the handle wafer 16. The device layer 12 and the handle wafer 16 may contain a single-crystal semiconductor material, such as single-crystal silicon, and may be lightly doped to have, for example, p-type conductivity. The dielectric layer 14 may be comprised of a dielectric material that provides low-index cladding and, in an embodiment, may be a buried oxide layer containing silicon dioxide.

A waveguide core 18 and a photodetector pad 20 connected to a portion of the waveguide core 18 are defined by patterning the device layer 12. The shapes of the waveguide core 18 and photodetector pad 20 may be defined by patterning trenches in the device layer 12 with lithography and etching processes, depositing a dielectric material (e.g., silicon dioxide) in the trenches to form shallow trench isolation regions 24, and planarizing with chemical-mechanical polishing. The shallow trench isolation regions 24 may penetrate fully through the device layer 12 to the dielectric layer 14.

The waveguide core 18 and photodetector pad 20 are arranged with alignment along a longitudinal axis 22. The photodetector pad 20 has a side surface 21, the waveguide core 18 is coupled to a portion of the side surface 21 by a direct physical connection, and the waveguide core 18 may be tapered with a width that increases with decreasing distance from the side surface 21.

Figure 3:
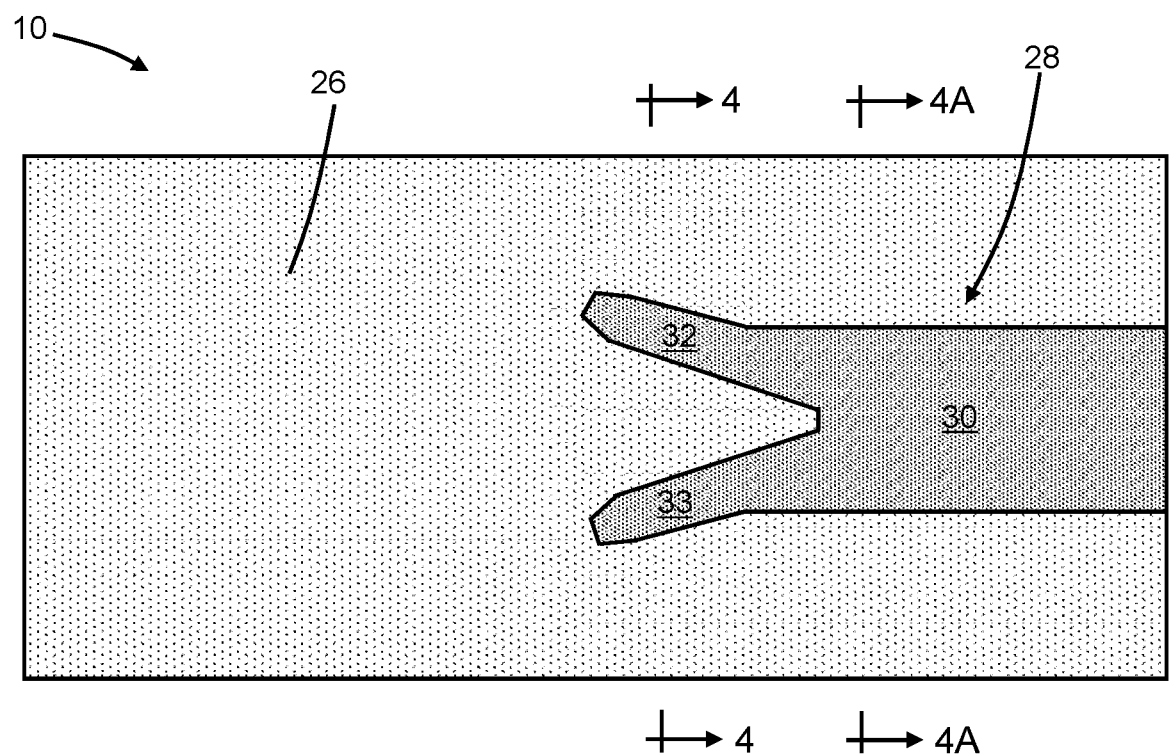
FIG. 3 is a top view of the structure at a fabrication stage of the processing method subsequent to FIG. 1.
Figure 4:
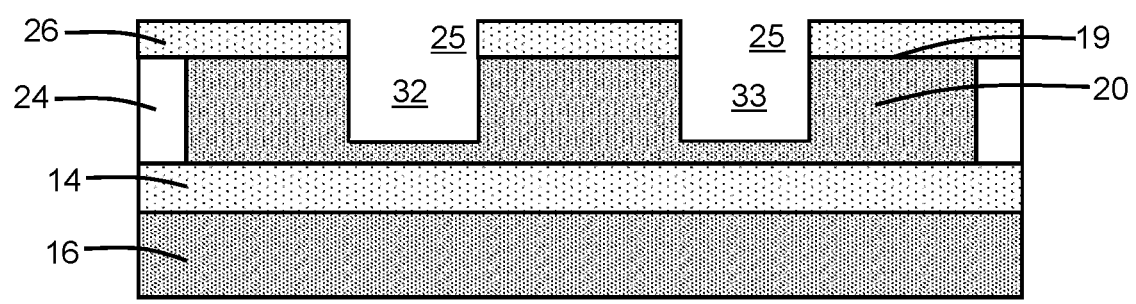
FIG. 4 is a cross-sectional view taken generally along line 4-4 in FIG. 3.
Figure 4A:
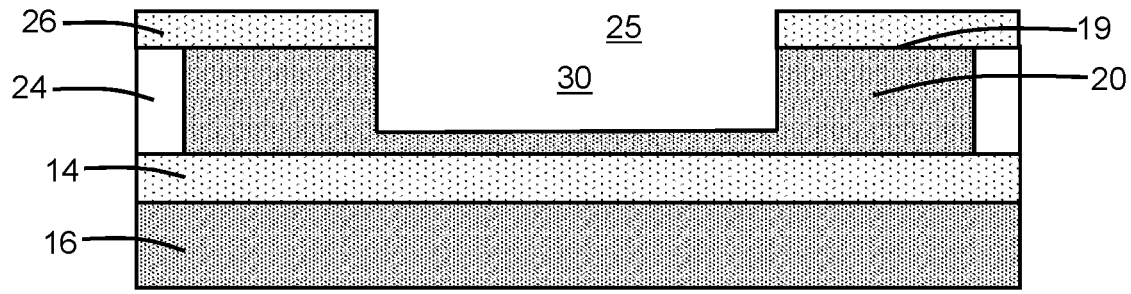
FIG. 4A is a cross-sectional view taken generally along line 4A-4A in FIG. 3.

With reference to FIGS. 3, 4, 4A in which like reference numerals refer to like features in FIGS. 1, 2 and at a subsequent fabrication stage, a dielectric layer 26 may be deposited and patterned by lithography and etching processes to define a window or opening having a shape for a subsequently-formed trench. The dielectric layer 26 may be composed of a dielectric material, such as silicon nitride. The opening 25, which penetrates fully through the dielectric layer 26, exposes an area on the top surface 19 of the photodetector pad 20. The exposed area is only a portion (i.e., a fraction) of the total area of the top surface 19 of the photodetector pad 20. The etching process may remove the material of the dielectric layer 26 selective to the material of the photodetector pad 20. As used herein, the terms "selective" and "selectivity" in reference to a material removal process (e.g., etching) denote that the material removal rate (i.e., etch rate) for the targeted material is higher than the material removal rate (i.e., etch rate) for at least another material exposed to the material removal.

A trench 28 is formed in the photodetector pad 20 and penetrates in depth partially through the photodetector pad 20. The trench 28 may be formed by an etching process, such as a reactive ion etching process. The patterned dielectric layer 26 functions as an etch mask during the etching process, and the opening 25 in the patterned dielectric layer 26 defines the location of trench 28 on a top surface 19 of the photodetector pad 20 and the shape for the trench 28. As a result, the trench 28 is surrounded in a tub in the photodetector pad 20 and the tub is bounded by the semiconductor material of the device layer 12. Surfaces of the photodetector pad 20 are exposed at the bottom of the trench 28 and at all sides of the trench 28.

The trench 28 includes a section 30, a section 32 that projects laterally from the section 30 in a longitudinal direction toward the waveguide core 18, and a section 33 that also projects laterally from the section 30 in a longitudinal direction toward the waveguide core 18. The sections 32, 33 of the trench 28 may have terminating regions that are positioned adjacent to the side surface 21. The terminating regions of the sections 32, 33 of the trench 28 may be spaced from the side surface 21 of the photodetector pad 20 by a gap, G, such that portions of the semiconductor material of the photodetector pad 20 are positioned between the terminating regions of the sections 32, 33 and the side surface 21. In an alternative embodiment, the terminating regions of the sections 32, 33 of the trench 28 may intersect the side surface 21 such that a gap is absent. In embodiments, the distance between the terminating regions of the sections 32, 33 of the trench 28 and the side surface 21 may range from 0 microns to 1 micron. The trench 28 is shaped with the sections 32, 33 projecting laterally as prongs in a direction along the longitudinal axis 22 toward the waveguide core 18. The waveguide core 18 may be symmetrically arranged relative to the sections 32, 33 with the section 32 on one side of the longitudinal axis 22, and with the section 33 on an opposite side of the longitudinal axis 22. The sections 32, 33 may have a shape that linearly varies over their respective lengths based on a linear function. In an alternative embodiment, sections 32, 33 may have a shape that non-linearly varies over their respective lengths based on a non-linear function, such as a quadratic, parabolic, or exponential function.

Figure 5:
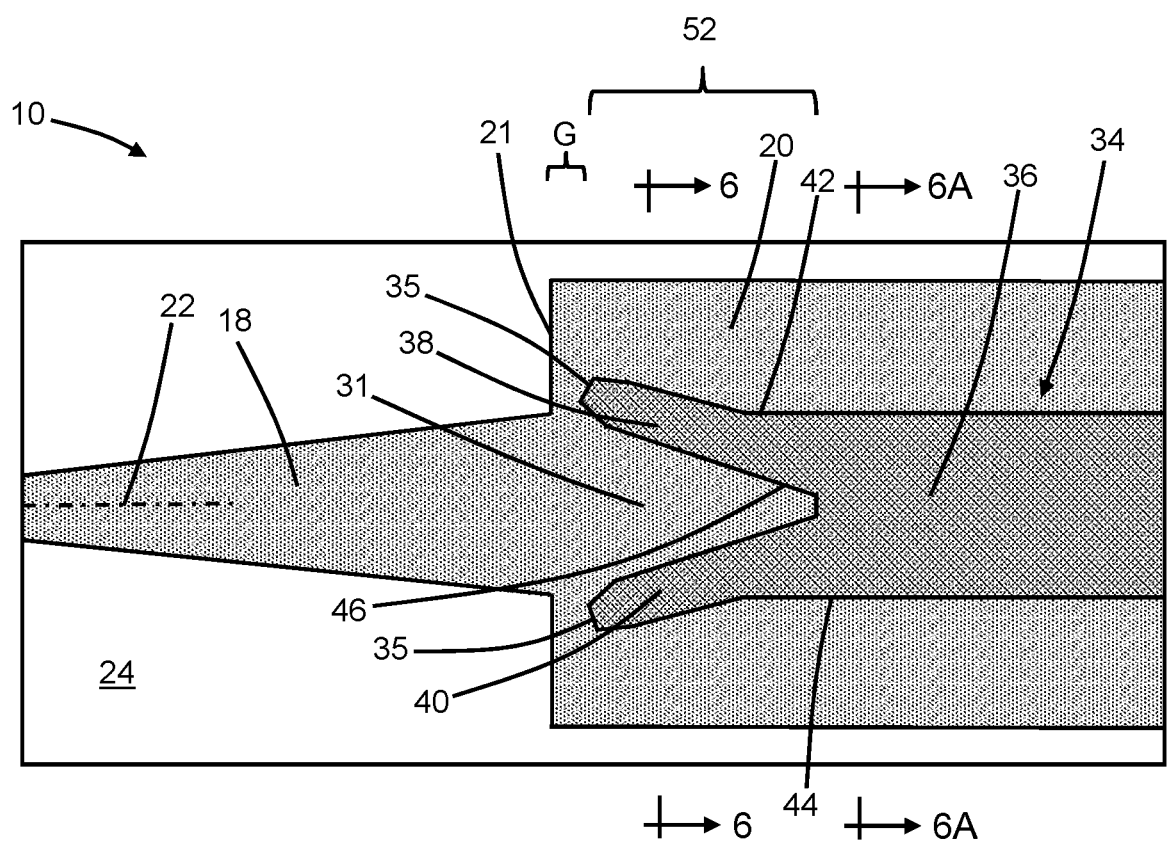
FIG. 5 is a top view of the structure at a fabrication stage of the processing method subsequent to FIG. 1.
Figure 6:
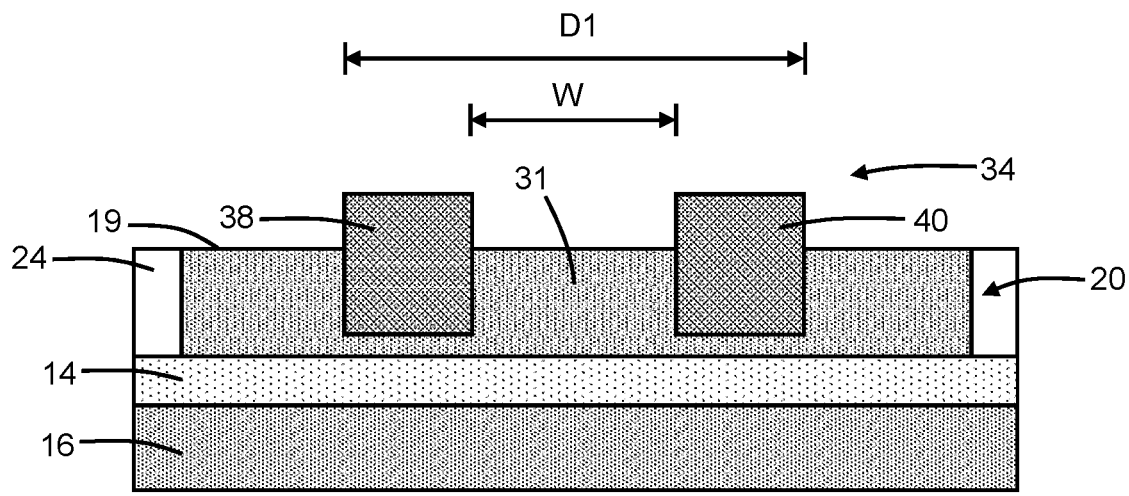
FIG. 6 is a cross-sectional view taken generally along line 6-6 in FIG. 5.
Figure 6A:
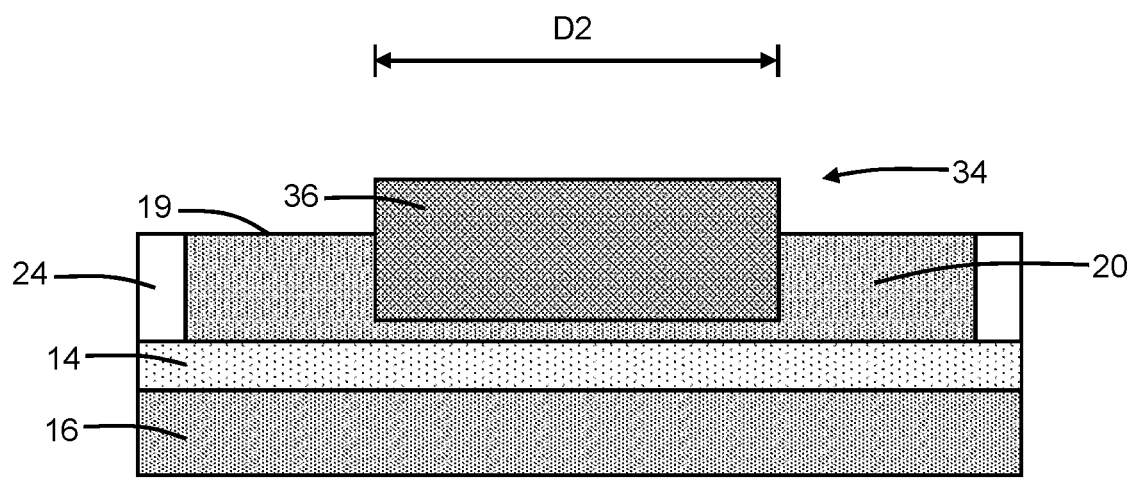
FIG. 6A is a cross-sectional view taken generally along line 6A-6A in FIG. 5.

With reference to FIGS. 5, 6, 6A in which like reference numerals refer to like features in FIGS. 3, 4, 4A and at a subsequent fabrication stage, a light-absorbing layer 34 is formed inside the trench 28 in the photodetector pad 20. In an embodiment, the light-absorbing layer 34 may be formed by depositing a light-absorbing material with a chemical vapor deposition process in the trench 28. In an embodiment, the light-absorbing layer 34 may be selectively deposited such that the light-absorbing material deposits inside the trench 28 but does not deposit on the dielectric layer 26. Subsequent to the formation of the light-absorbing layer 34, the dielectric layer 26 may be removed by a selective etching process.

The light-absorbing layer 34 may define a light-absorbing region of a photodetector, and light-absorbing layer 34 may be comprised of a material that generates charge carriers from the absorbed light. In an embodiment, the light-absorbing layer 34 may comprise a material having a composition that includes germanium. In an embodiment, the light-absorbing layer 34 may comprise a material having a composition that exclusively contains elemental germanium. The light-absorbing layer 34 may be formed inside the trench 28 such that the light-absorbing material is at least partially embedded in the photodetector pad 20. In the representative embodiment, the light-absorbing layer 34 includes a portion that is positioned above the top surface 19 of the photodetector pad 20. In an alternative embodiment, the light-absorbing layer 34 may be coplanar with the top surface 19 of the photodetector pad 20.

The light-absorbing layer 34 adapts and conforms to the shape of the trench 28 when formed. In that regard, the light-absorbing layer 34 includes a body 36, a taper 38 that projects laterally from the body 36 in a longitudinal direction toward the waveguide core 18, and a taper 40 that also projects laterally from the body 36 in a longitudinal direction toward the waveguide core 18. The body 36, the taper 38, and the taper 40 of the light-absorbing layer 34 are respectively positioned in the different corresponding sections 30, 32, 33 of the trench 28.

The tapers 38, 40 of the light-absorbing layer 34 may have non-pointed, blunt tips 35 that are positioned adjacent to the side surface 21 of the photodetector pad 20. The tips 35 of the tapers 38, 40 may be spaced from the side surface 21 of the photodetector pad 20 by the gap, G, such that portions of the semiconductor material of the photodetector pad 20 are positioned between the tips of the tapers 38, 40 and the side surface 21. In an alternative embodiment, the tapers 38, 40 of the light-absorbing layer 34 may intersect the side surface 21 such that a gap is absent. In embodiments, the distance between the tips 35 of the tapers 38, 40 and the side surface 21 may range from 0 microns to 1 micron. The light-absorbing layer 34 reproduces the shape of the trench 28 with the tapers 38, 40 projecting as prongs in a direction toward the waveguide core 18.

A tapered section 31 of the photodetector pad 20 is positioned in the space between the taper 38 and the taper 40. The waveguide core 18 may be symmetrically arranged relative to the tapers 38, 40 with the taper 38 on one side of the longitudinal axis 22 and tapered section 31, and with the taper 40 on an opposite side of the longitudinal axis 22 and tapered section 31.

The tapers 38, 40 of the light-absorbing layer 34 and the tapered section 31 of the photodetector pad 20 between the tapers 38, 40 collectively define a coupling region 52 that optically couples the waveguide core 18 with the light-absorbing layer 34. The coupling region 52 is a composite of the material (e.g., germanium) of the light-absorbing layer 34 in tapers 38, 40 and the different material (e.g., silicon) of the photodetector pad 20 in tapered section 31. The light-absorbing layer 34 has a side surface 42 and a side surface 44 opposite to the side surface 42, and a side surface 46. The tapered section 31 of the photodetector pad 20 has an interface with the side surface 46 over which the tapered section 31 and the side surface 46 are contacting.

The distance, D1, between the side surface 42 of the taper 38 and the side surface 44 of the taper 40 in the coupling region 52 may increase with decreasing distance from the waveguide core 18 and the side surface 21 of the photodetector pad 20. In an embodiment, the distance, D1, distance between the side surface 42 of the taper 38 and the side surface 44 of the taper 40 in the coupling region 52 may be greater than the distance, D2, between the side surfaces 42, 44 in the body 36. The width, W, of the tapered section 31 of the photodetector pad 20 may increase with increasing distance from the body 36. The width, W, of the tapered section 31 of the photodetector pad 20 may increase with decreasing distance from the waveguide core 18 and the side surface 21 of the photodetector pad 20.

In alternative embodiments, other material combinations may be used to construct the structure 10. For example, the waveguide core 18 and photodetector pad 20 be comprised of silicon nitride.

Figure 7:
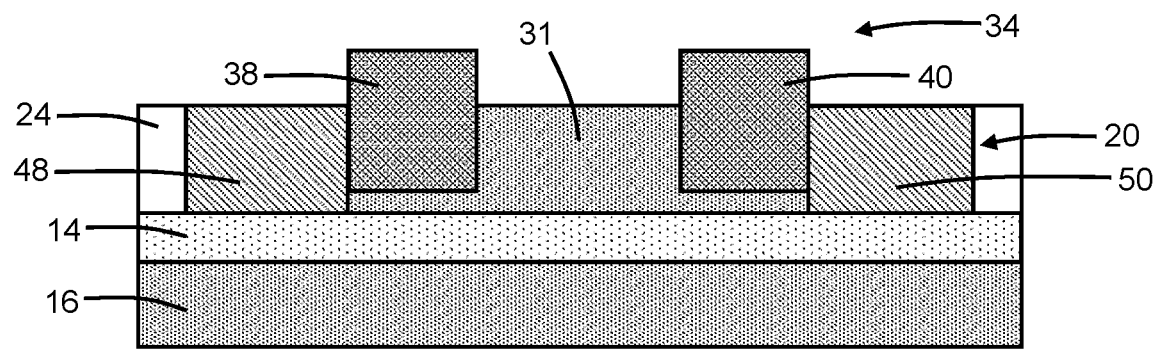
FIGS. 7, 7A are cross-sectional views at a fabrication stage of the processing method subsequent to FIGS. 6, 6A.
Figure 7A:
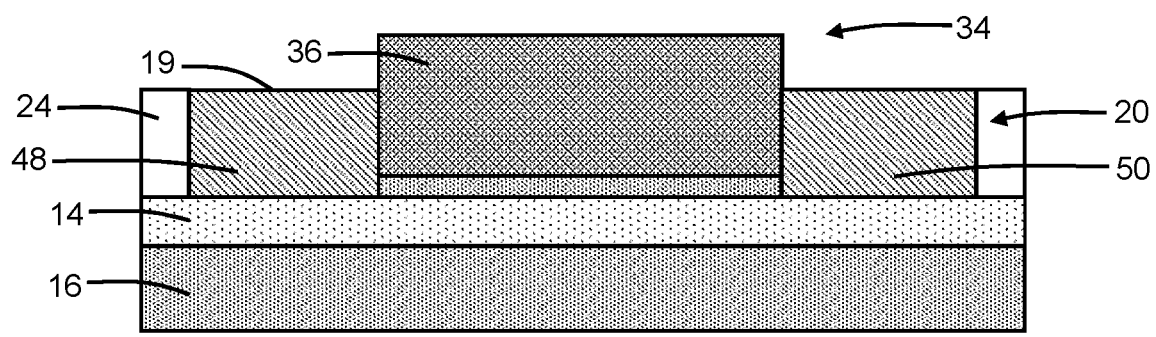

With reference to FIGS. 7, 7A in which like reference numerals refer to like features in FIGS. 6, 6A and at a subsequent fabrication stage, doped regions 48, 50 are formed in respective portions of the photodetector pad 20. The doped regions 48, 50 may extend through the entire thickness of the photodetector pad 20 to the underlying dielectric layer 14. The doped region 48 and the doped region 50 may be arranged at the opposite side surfaces 42, 44 of the light-absorbing layer 34 to define an anode and a cathode of a photodetector that also includes the light-absorbing layer 34 and the photodetector pad 20. The tapered section 31 of the photodetector pad 20 may be masked during the implantations and not belong to either of the doped regions 48, 50.

The doped region 48 may be formed by, for example, ion implantation with an implantation mask with an opening that determines the implanted area of the photodetector pad 20. The implantation mask may include a layer of a light-sensitive material, such as a photoresist, applied by a spin-coating process, pre-baked, exposed to light projected through a photomask, baked after exposure, and developed with a chemical developer to define openings arranged over the areas to be implanted. The implantation conditions (e.g., ion species, dose, kinetic energy) may be selected to tune the electrical and physical characteristics of the doped region 48. The implantation mask may be stripped after forming the doped region 48. In an embodiment, the semiconductor material of the doped region 48 may contain a p-type dopant (e.g., boron) that provides p-type electrical conductivity.

The doped region 50 may be formed by, for example, ion implantation with an implantation mask with an opening that determines the implanted area of the photodetector pad 20. The implantation mask may include a layer of a light-sensitive material, such as a photoresist, applied by a spin-coating process, pre-baked, exposed to light projected through a photomask, baked after exposure, and developed with a chemical developer to define openings arranged over the areas to be implanted. The implantation conditions (e.g., ion species, dose, kinetic energy) may be selected to tune the electrical and physical characteristics of the doped region 50. The implantation mask may be stripped after forming the doped region 50. In an embodiment, the semiconductor material of the doped region 50 may contain an n-type dopant (e.g., phosphorus and/or arsenic) that provides n-type electrical conductivity.

Middle-of-line (MOL) processing and back-end-of-line (BEOL) processing follow, which includes formation of silicide, contacts, vias, and wiring for an interconnect structure that is coupled with the photodetectors. In particular, separate sets of contacts may be formed in a dielectric layer of the interconnect structure that respectively extend to the doped regions 48, 50.

In use, laser light may be guided by the waveguide core 18 to the light-absorbing layer 34. The light-absorbing layer 34 absorbs photons of the laser light and converts the absorbed photons into charge carriers. The biasing of the doped regions 48, 50 causes the charge carriers to be collected and output to provide, as a function of time, a measurable photocurrent.

The coupling region 52 may be effective to improve the performance of the photodetector by, for example, suppressing back reflection. The coupling region 52 may also promote optical coupling of laser light to the light-absorbing layer 34 by both butt-end and side evanescent coupling mechanisms.

Figure 8:
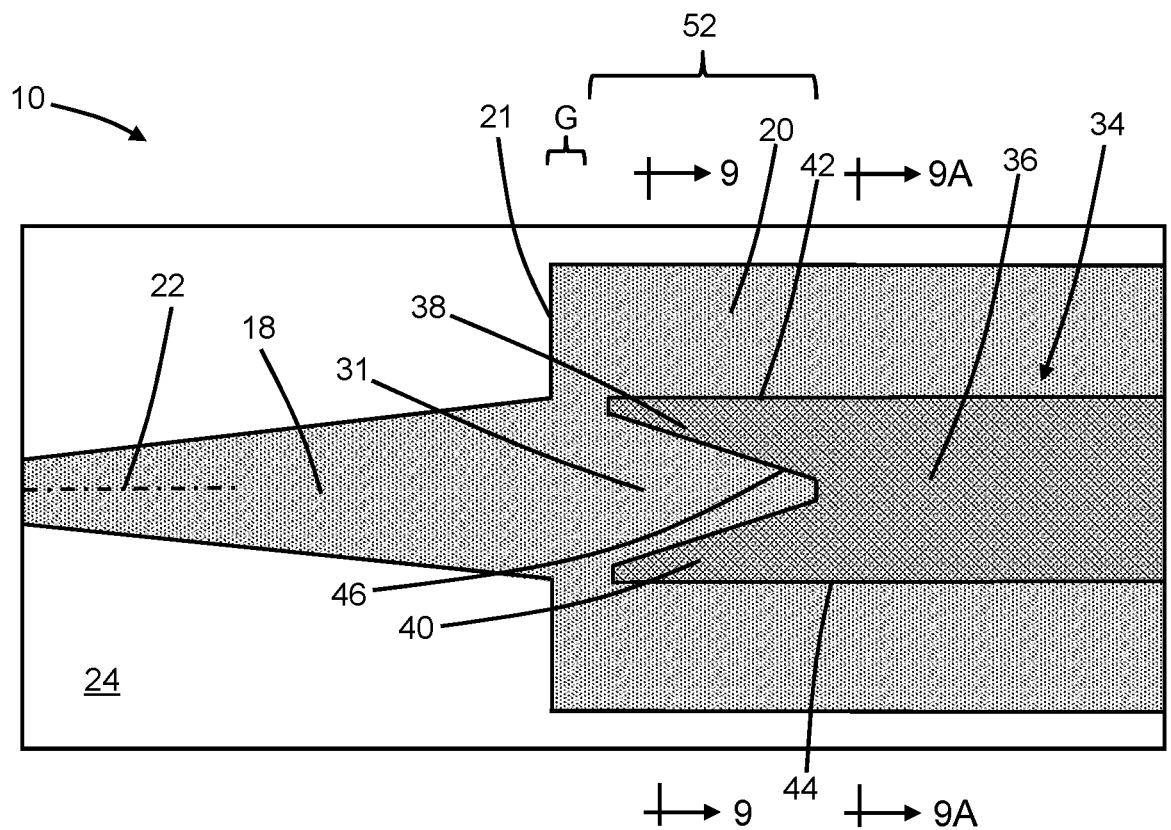
FIG. 8 is a top view of a structure in accordance with alternative embodiments of the invention.
Figure 9:
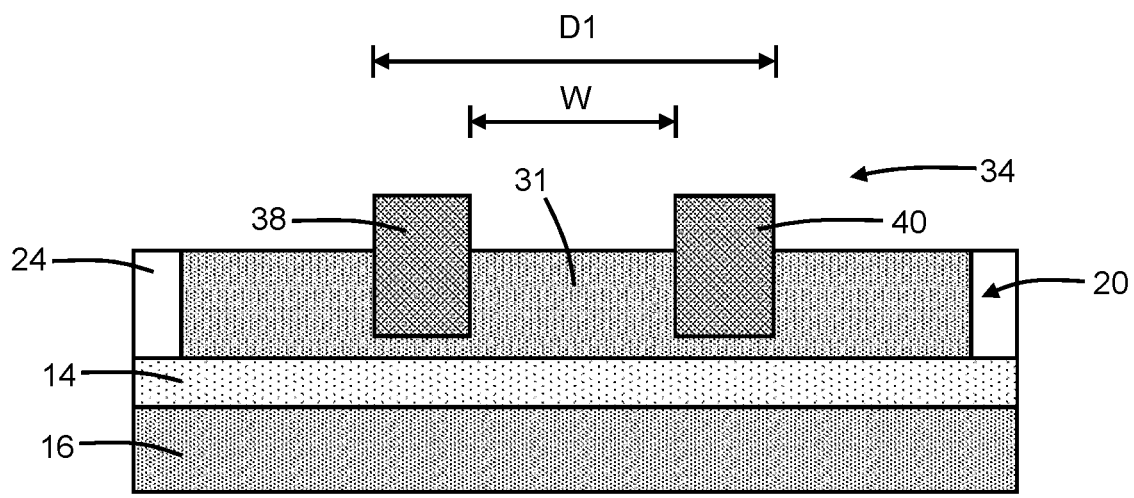
FIG. 9 is a cross-sectional view taken generally along line 9-9 in FIG. 8.
Figure 9A:
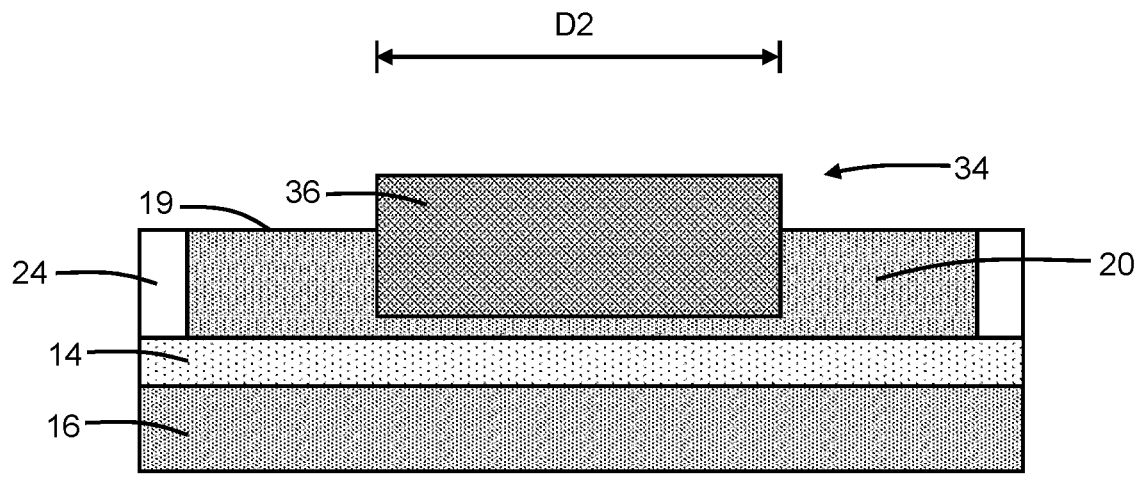
FIG. 9A is a cross-sectional view taken generally along line 9A-9A in FIG. 8.

With reference to FIGS. 8, 9, 9A in which like reference numerals refer to like features in FIGS. 5, 6, 6A and in accordance with alternative embodiments, the distance, D1, between the side surface 42 of the taper 38 and the side surface 44 of the taper 40 in the coupling region 52 may be constant with decreasing distance from the waveguide core 18 and the side surface 21 of the photodetector pad 20. In an embodiment, the distance, D1, between the side surface 42 of the taper 38 and the side surface 44 of the taper 40 in the coupling region 52 may be equal to the distance, D2, between the side surfaces 42, 44 of the body 36. Independent of this modification to the tapers 38, 40, the width, W, of the tapered section 31 of the photodetector pad 20 decreases with increasing distance from the waveguide core 18.

Figure 10:
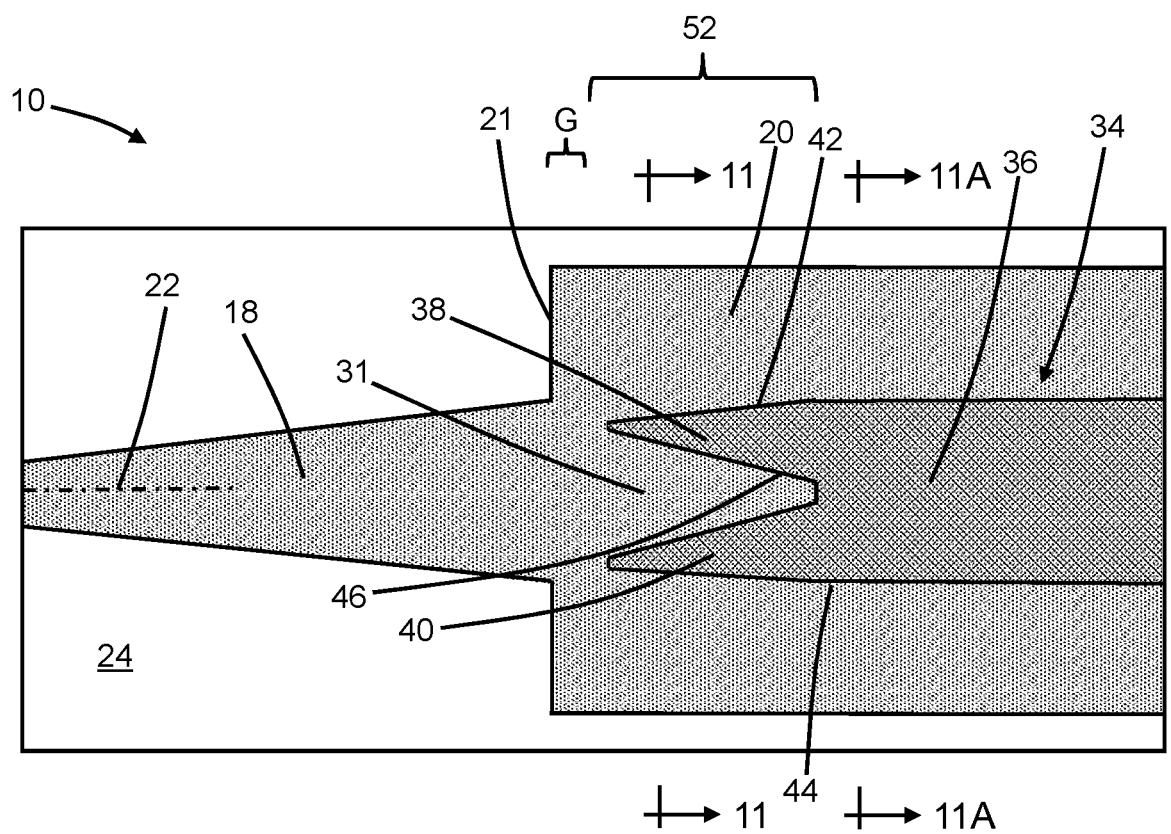
FIG. 10 is a top view of a structure in accordance with alternative embodiments of the invention.
Figure 11:
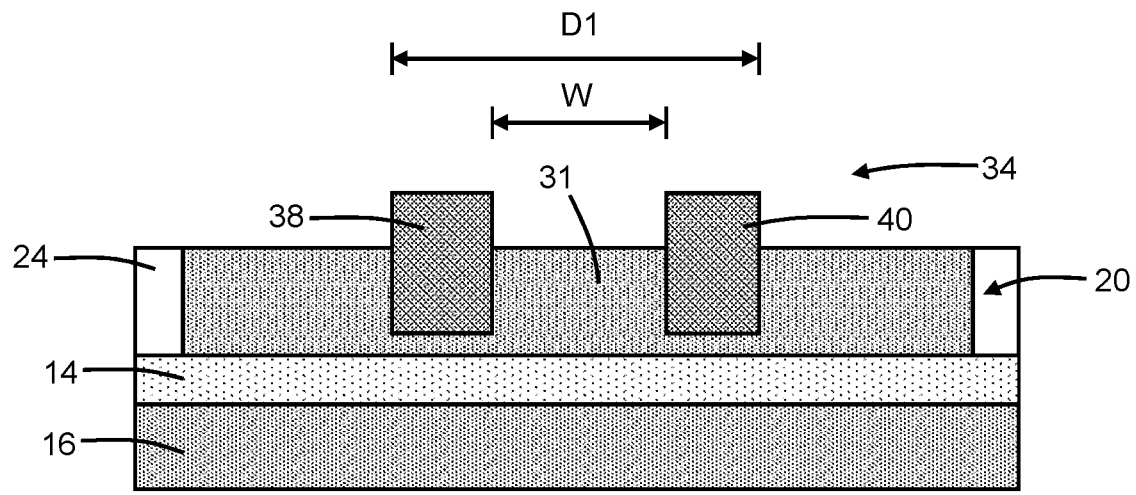
FIG. 11 is a cross-sectional view taken generally along line 11-11 in FIG. 10.
Figure 11A:
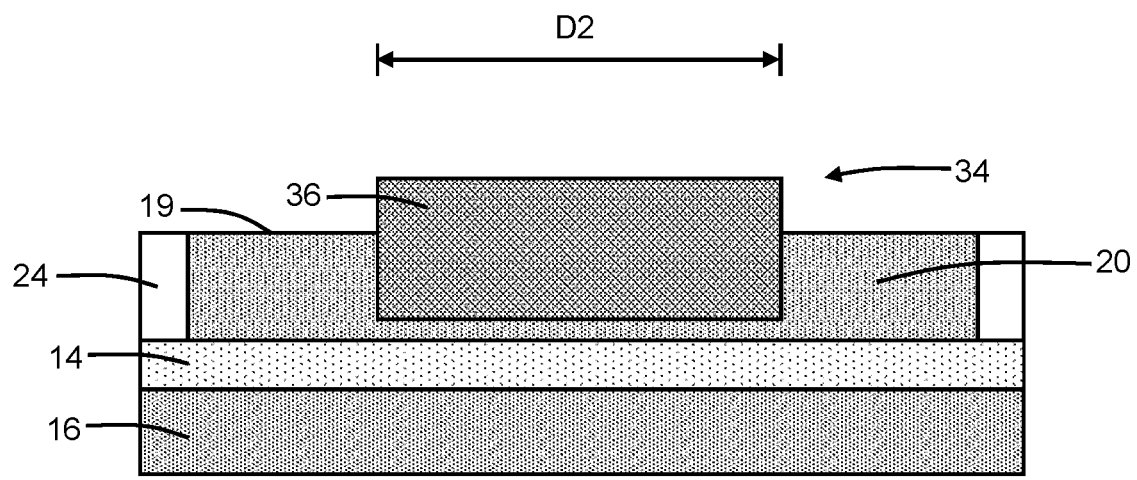
FIG. 11A is a cross-sectional view taken generally along line 11A-11A in FIG. 10.

With reference to FIGS. 10, 11, 11A in which like reference numerals refer to like features in FIGS. 5, 6, 6A and in accordance with alternative embodiments, the distance, D1, between the side surface 42 of the taper 38 and the side surface 44 of the taper 40 in the coupling region 52 may decrease with decreasing distance from the waveguide core 18 and the side surface 21 of the photodetector pad 20. In an embodiment, the distance, D1, between the side surface 42 of the taper 38 and the side surface 44 of the taper 40 in the coupling region 52 may be less than the distance, D2, between the side surfaces 42, 44 in the body 36. Independent of this modification to the tapers 38, 40, width, W, of the tapered section 31 of the photodetector pad 20 decreases with increasing distance from the waveguide core 18.

Figure 12:
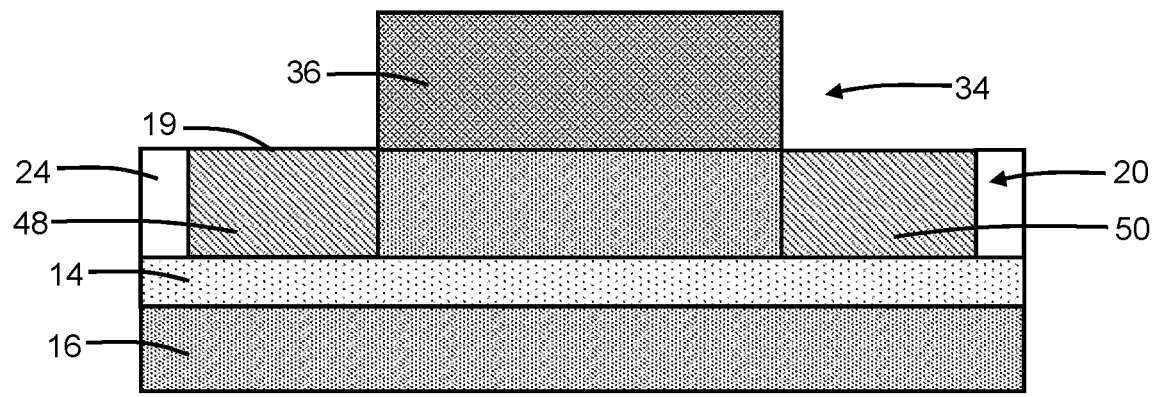
FIG. 12 is a cross-sectional view of a structure in accordance with alternative embodiments of the invention.

With reference to FIG. 12 in which like reference numerals refer to like features in FIG. 7A and in accordance with alternative embodiments, the light-absorbing layer 34 may be formed on the top surface 19 of the photodetector pad 20 instead of being formed in the trench 28 in the photodetector pad 20. The light-absorbing layer 34 is arranged fully above the photodetector pad 20 with the tapered section 31 of the photodetector pad 20 positioned in a level that is fully below the level of the tapers 38, 40 of the light-absorbing layer 34. The light-absorbing layer 34 may have a shape as shown in FIG. 5, FIG. 8, or FIG. 10.

Figure 13:
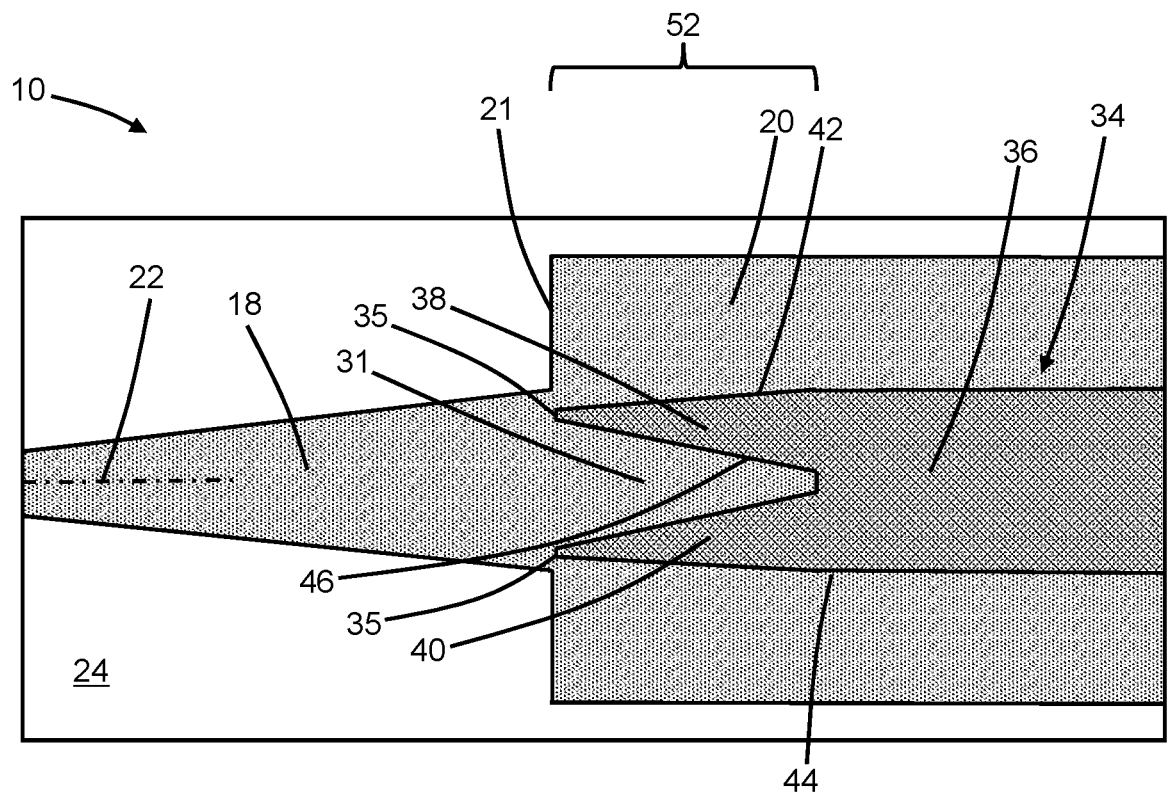
FIG. 13 is a top view of a structure in accordance with alternative embodiments of the invention.

With reference to FIG. 13 in which like reference numerals refer to like features in FIG. 10 and in accordance with alternative embodiments, the respective tips 35 of the tapers 38, 40 may extend to intersect the side surface 21 of the photodetector pad 20. The modification may be accomplished by changing the shape of the sections 32, 33 of the trench 28 during the patterning of the photodetector pad 20. Independent of this modification to the tapers 38, 40, the width, W, of the tapered section 31 of the photodetector pad 20 decreases with increasing distance from the waveguide core 18. In the representative embodiment, the respective tips 35 of the tapers 38, 40 may extend to intersect a portion of the side surface 21 to which the waveguide core 18 is coupled. The light-absorbing layer 34 may alternatively have a shape as shown in either FIG. 5 or FIG. 8 with tips 35 intersecting the side surface 21.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a waveguide core; and
a photodetector including a photodetector pad coupled to the waveguide core and a light-absorbing layer coupled to the photodetector pad, the light-absorbing layer including a body, a first taper that projects laterally from the body toward the waveguide core, and a second taper that projects laterally from the body toward the waveguide core, the photodetector pad having a side surface, the first taper and the second taper of the light-absorbing layer each having a respective non-pointed tip that is spaced from the side surface by a gap, and the photodetector pad including a tapered section that is laterally positioned between the first taper and the second taper of the light-absorbing layer,
wherein the waveguide core is connected to the side surface of the photodetector pad, and the waveguide core is tapered with a width that increases with decreasing distance from the side surface of the photodetector pad.

2. The structure of claim 1 wherein the tapered section of the photodetector pad and the waveguide core are aligned along a longitudinal axis.

3. The structure of claim 1 wherein the photodetector pad and the waveguide core comprise single-crystal silicon, and the light-absorbing layer comprises germanium.

4. The structure of claim 1 wherein the photodetector pad includes an anode and a cathode, and the light-absorbing layer is laterally positioned between the anode and the cathode.

5. The structure of claim 1 wherein the photodetector pad has a top surface, and the light-absorbing layer is positioned on the top surface of the photodetector pad.

6. The structure of claim 1 wherein the photodetector pad has a top surface and a trench extending from the top surface partially through the photodetector pad, and the light-absorbing layer is positioned in the trench.

7. The structure of claim 1 wherein the tapered section of the photodetector pad has a width that decreases with increasing distance from the side surface of the photodetector pad.

8. The structure of claim 1 wherein the first taper has a first side surface, the second taper has a second side surface, and the first side surface of the first taper is laterally separated from the second side surface of the second taper by a distance that increases with decreasing distance from the side surface of the photodetector pad.

9. The structure of claim 8 wherein the tapered section of the photodetector pad has a width that decreases with increasing distance from the side surface of the photodetector pad.

10. The structure of claim 1 wherein the photodetector pad is wider than the body of the light-absorbing layer.

11. The structure of claim 1 wherein the first taper diverges away from the second taper with increasing distance from the body.

12. A structure comprising:
a waveguide core; and
a photodetector including a photodetector pad coupled to the waveguide core and a light-absorbing layer coupled to the photodetector pad, the light-absorbing layer including a body, a first taper that projects laterally from the body toward the waveguide core, and a second taper that projects laterally from the body toward the waveguide core, and the photodetector pad including a tapered section that is laterally positioned between the first taper and the second taper of the light-absorbing layer,
wherein the photodetector pad has a side surface, the waveguide core is coupled to a portion of the side surface, the first taper has a first side surface, the second taper has a second side surface, and the first side surface of the first taper is laterally separated from the second side surface of the second taper by a distance that is constant with decreasing distance from the side surface of the photodetector pad.

13. The structure of claim 12 wherein the tapered section of the photodetector pad has a width that decreases with increasing distance from the side surface.

14. The structure of claim 12 wherein the photodetector pad and the waveguide core comprise single-crystal silicon, and the light-absorbing layer comprises germanium.

15. The structure of claim 12 wherein the photodetector pad includes an anode and a cathode, and the light-absorbing layer is laterally positioned between the anode and the cathode.

16. A structure comprising:
a waveguide core; and
a photodetector including a photodetector pad coupled to the waveguide core and a light-absorbing layer coupled to the photodetector pad, the light-absorbing layer including a body, a first taper that projects laterally from the body toward the waveguide core, and a second taper that projects laterally from the body toward the waveguide core, and the photodetector pad including a tapered section that is laterally positioned between the first taper and the second taper of the light-absorbing layer,
wherein the photodetector pad has a side surface, the waveguide core is coupled to a portion of the side surface, the first taper has a first side surface, the second taper has a second side surface, and the first side surface of the first taper is laterally separated from the second side surface of the second taper by a distance that decreases with decreasing distance from the side surface of the photodetector pad.

17. The structure of claim 16 wherein the tapered section of the photodetector pad has a width that decreases with increasing distance from the side surface.

18. The structure of claim 16 wherein the photodetector pad and the waveguide core comprise single-crystal silicon, and the light-absorbing layer comprises germanium.

19. The structure of claim 16 wherein the photodetector pad includes an anode and a cathode, and the light-absorbing layer is laterally positioned between the anode and the cathode.

* * * * *